(12) United States Patent
Lin et al.

(10) Patent No.: US 9,543,977 B2
(45) Date of Patent: Jan. 10, 2017

(54) DECIMATORLESS CONTINUOUS-TIME DELTA-SIGMA ANALOG-TO-DIGITAL RECEIVER

(71) Applicant: HIMAX TECHNOLOGIES LIMITED, Tainan (TW)

(72) Inventors: Chang-Hui Lin, Tainan (TW); Yaw-Guang Chang, Tainan (TW); Guan-Ying Huang, Tainan (TW)

(73) Assignee: Himax Technologies Limited, Tainan (TW)

( * ) Notice: Subject to any disclaimer, the term of this patent is extended or adjusted under 35 U.S.C. 154(b) by 0 days.

(21) Appl. No.: 14/535,244

(22) Filed: Nov. 6, 2014

(65) Prior Publication Data

US 2016/0080019 A1 Mar. 17, 2016

Related U.S. Application Data

(60) Provisional application No. 62/049,851, filed on Sep. 12, 2014.

(51) Int. Cl.
*H04B 1/16* (2006.01)
*H03M 3/00* (2006.01)
*H03G 3/30* (2006.01)

(52) U.S. Cl.
CPC ........... *H03M 3/462* (2013.01); *H03G 3/3052* (2013.01)

(58) Field of Classification Search
CPC .............. H03K 7/02; H03K 9/00; H03M 1/12; H03M 1/20; H03M 3/00; H03M 3/02; H03M 7/00; H04B 1/06; H04B 1/10; H04B 1/18; H04B 1/38; H04B 14/06; H04B 15/00; H04B 1/16; H04L 5/12; H04L 27/00; H04L 27/06; H04N 3/27; H04N 5/44; H04N 5/50; H04N 21/426; H04N 21/438
USPC ................. 341/69, 106, 120, 131, 143, 155, 156,341/172; 348/553, 554, 731, 725; 375/219, 235, 375/259, 265, 316, 324, 340, 350; 455/187.1, 455/255, 266, 333
See application file for complete search history.

(56) References Cited

U.S. PATENT DOCUMENTS

| | | | | |
|---|---|---|---|---|
| 3,906,487 | A | * | 9/1975 | Siems ........................... 341/139 |
| 6,459,743 | B1 | | 10/2002 | Lipka |
| 6,748,006 | B1 | * | 6/2004 | McDonough et al. ....... 375/140 |
| 2004/0213333 | A1 | * | 10/2004 | Huang ................... H04B 1/707 375/150 |
| 2007/0035426 | A1 | * | 2/2007 | Schreier et al. .............. 341/143 |
| 2007/0236374 | A1 | * | 10/2007 | Brueske et al. .............. 341/143 |
| 2012/0326904 | A1 | * | 12/2012 | Jensen ................. H03M 3/396 341/131 |
| 2014/0267928 | A1 | * | 9/2014 | Coban et al. ................. 348/731 |

FOREIGN PATENT DOCUMENTS

TW I337461 B 2/2011

OTHER PUBLICATIONS

A. Gupta, What's the Difference Between Continuous-Time and Discrete-Time Delta Sigma ADCs, May 2014.*

* cited by examiner

*Primary Examiner* — Shawkat M Ali
(74) *Attorney, Agent, or Firm* — Donald E. Stout; Stout, Uxa & Buyan, LLP

(57) ABSTRACT

A decimatorless continuous-time delta-sigma analog-to-digital receiver includes a continuous-time delta-sigma modulator (CTDSM) that receives a receiving signal and is configured to encode analog signals into digital signals; and (Continued)

a demodulator that receives a digital output of the CTDSM and is configured to recover information content from the receiving signal.

6 Claims, 4 Drawing Sheets

DECIMATORLESS CONTINUOUS-TIME DELTA-SIGMA ANALOG-TO-DIGITAL RECEIVER

This application claims the benefit under 35 U.S.C. 119(e) of the filing date of Provisional U.S. Application Ser. No. 62/049,851, entitled Decimatorless Continuous-Time-Delta-Sigma Analog-to-Digital Receiver, filed on Sep. 12, 2014, and expressly incorporated herein by reference, in its entirety.

BACKGROUND OF THE INVENTION

1. Field of the Invention

The present invention generally relates to a communication receiver, and more particularly to a decimatorless continuous-time delta-sigma analog-to-digital receiver.

2. Description of Related Art

FIG. 1 shows a block diagram illustrated of a conventional receiver 100 that includes an automatic gain controller (AGC) 11, an anti-aliasing filter (AAF) 12, a delta-sigma modulator (DSM) 13, a decimator (DEC) 14 and a demodulator 15. The AAF 12 is commonly implemented by a low-pass filter that attenuates signals with frequencies higher than a cutoff frequency such that the signals may not be affected by frequency aliasing. In view of the fact that the sampling rate of a digital signal from the DSM 13 is usually higher than the cutoff frequency, the DEC 14 is ordinarily used to reduce the sampling rate.

Due to increasing miniaturization and cost down in the communication technology for electronic devices, particularly handheld electronic devices, a need has arisen to propose a novel communication receiver with more compact circuit area and reduced manufacturing cost.

SUMMARY OF THE INVENTION

In view of the foregoing, it is an object of the embodiment of the present invention to provide a decimatorless continuous-time delta-sigma analog-to-digital receiver without using a decimator and/or anti-aliasing filter, thereby reducing power consumption, circuit area and associated manufacturing cost.

According to one embodiment, a decimatorless continuous-time delta-sigma analog-to-digital receiver includes a continuous-time delta-sigma modulator (CTDSM) and a demodulator. The CTDSM receives a receiving signal and is configured to encode analog signals into digital signals. The demodulator receives a digital output of the CTDSM and is configured to recover information content from the receiving signal.

DETAILED DESCRIPTION OF THE INVENTION

Figure 2:
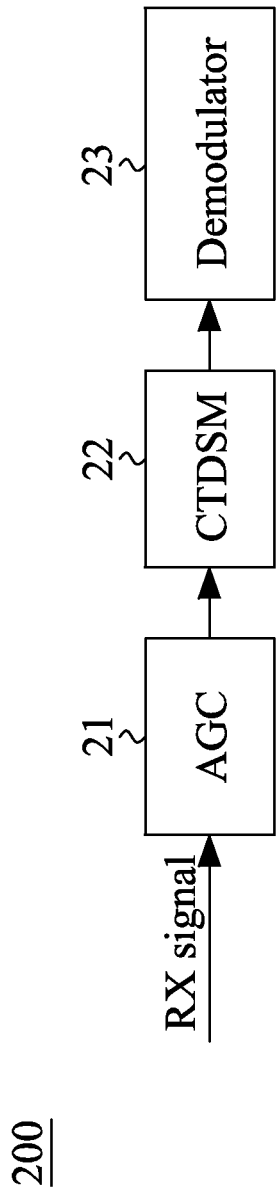
FIG. 2 shows a block diagram illustrated of a decimatorless continuous-time delta-sigma analog-to-digital receiver according to one embodiment of the present invention.

FIG. 2 shows a block diagram illustrated of a decimatorless continuous-time delta-sigma analog-to-digital receiver ("receiver" hereinafter) 200 according to one embodiment of the present invention. In the embodiment, the receiver 200 may optionally include an automatic gain controller (AGC) 21 that receives a receiving (RX) signal and automatically controls an amplification level such that the controlled amplification level may lie in a linear working region of a latter stage or stages.

Figure 1:
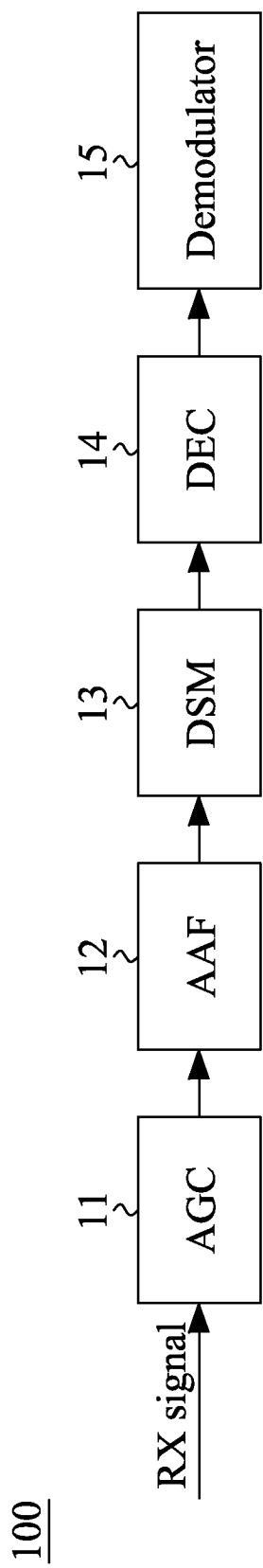
FIG. 1 shows a block diagram illustrated of a conventional receiver.

The receiver 200 of the embodiment may include continuous-time delta-sigma modulator (CTDSM) 22 that receives the original RX signal or the RX signal from the AGC 21. The CTDSM 22 is configured to encode analog signals into digital signals. The CTDSM 22, as typical continuous-time delta-sigma converters that employ a continuous-time noise-shaping filter (NSF), may possess low-pass filtering function. Accordingly, the anti-aliasing filter (AAF), such as the AAF 12 in FIG. 1, of conventional delta-sigma analog-to-digital receivers may thus be omitted, therefore reducing power consumption, circuit area and associated manufacturing cost.

The receiver 200 of the embodiment may further include a demodulator 23 that receives a digital output of the CTDSM 22. The demodulator 23 is configured to recover information content from the modulated RX signal. According to one aspect of the embodiment, the demodulator 23 works at a frequency that is at least higher than a cut-off frequency of the low-pass filtering mentioned above. As a result, the decimator, such as the DEC 14 in FIG. 1, of conventional delta-sigma analog-to-digital receivers may thus be omitted, therefore reducing power consumption, circuit area and associated manufacturing cost.

Figure 3A:
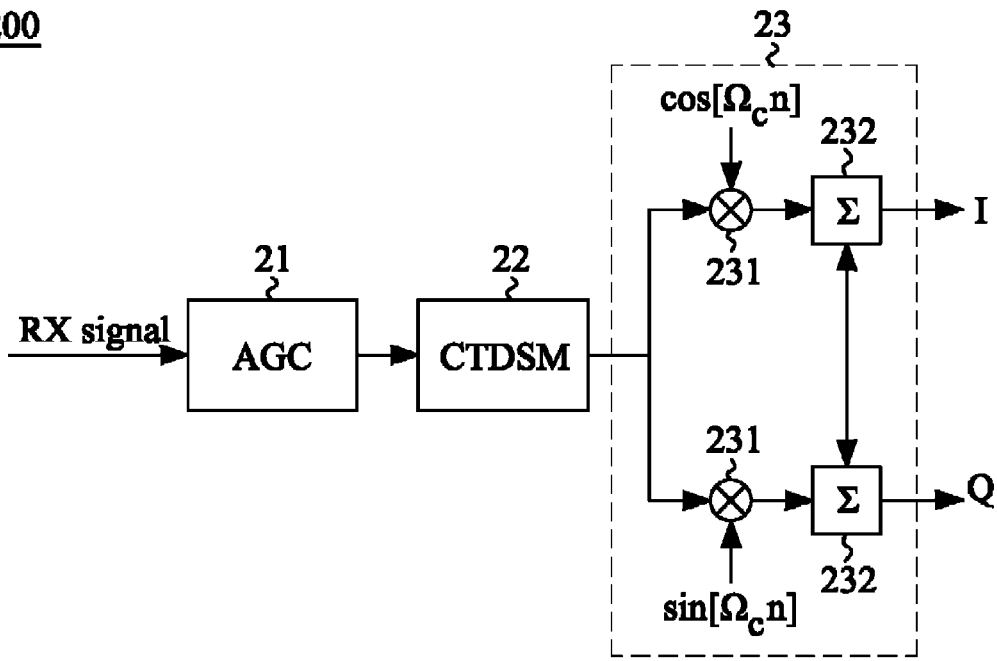
FIG. 3A shows a detailed block diagram of FIG. 2 illustrating a quadrature demodulator.

FIG. 3A shows a detailed block diagram of FIG. 2 illustrating a quadrature demodulator (or phase mixer) 23. In the figure, the digital output of the CTDSM 22 is phase mixed (or multiplied) by a pair of multipliers (or phase mixers) 231. Specifically, the multipliers 231 respectively multiply the digital output of the CTDSM 22 by quadrature carriers (e.g., sinusoids), thereby resulting in phase mixed digital outputs, respectively. In the embodiment, the sinusoids, for example, a cosine wave $\cos[\Omega_c n]$ and a sine wave $\sin[\Omega_c n]$, are out of phase with each other by 90°. The phase mixed digital outputs are then summed by adders 232, respectively, thereby resulting in recovered contents I and Q of the RX signal.

Figure 3B:
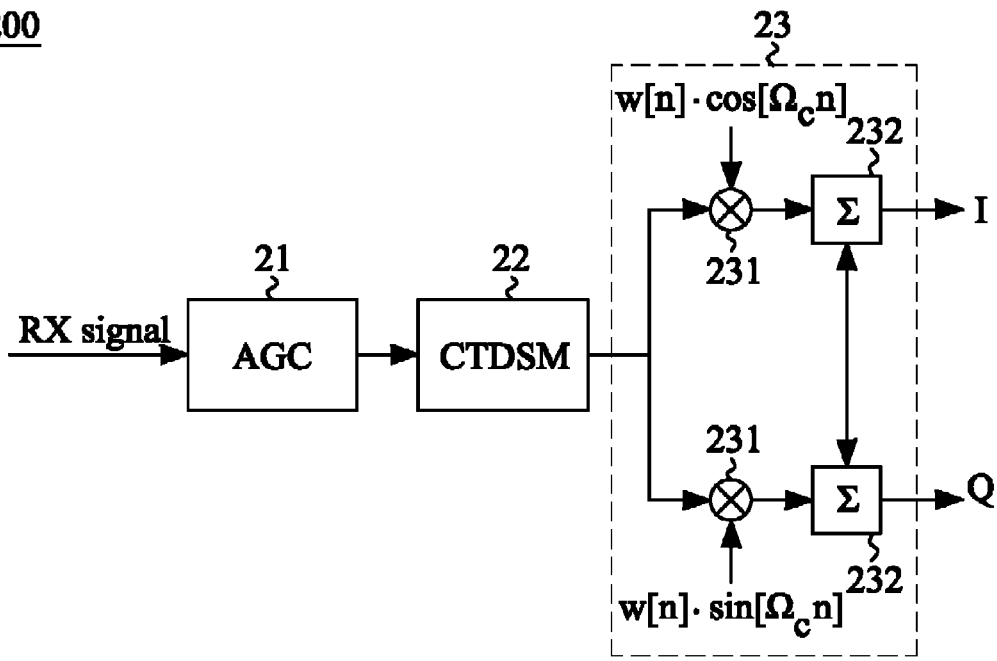
FIG. 3B shows a detailed block diagram of FIG. 2 illustrating another quadrature demodulator.

FIG. 3B shows a detailed block diagram of FIG. 2 illustrating another quadrature demodulator (or phase mixer) 23. The quadrature demodulator 23 of FIG. 3B is similar to that in FIG. 3A with the exception that, the multipliers 231 multiply the digital output of the CTDSM 22 by windowed quadrature carriers (e.g., sinusoids), respectively, for decreasing effect of radio-frequency interference (RFI) on the quadrature carriers. Specifically, the windowed quadrature carriers are generated by multiplying the quadrature carriers with a window function w[n], which is a mathematical function that is zero-valued outside of a predefined interval. The window function w[n] of the embodiment may, for example, be Kaiser window, Hanning window, Hamming window or Blackman window.

Figure 4:
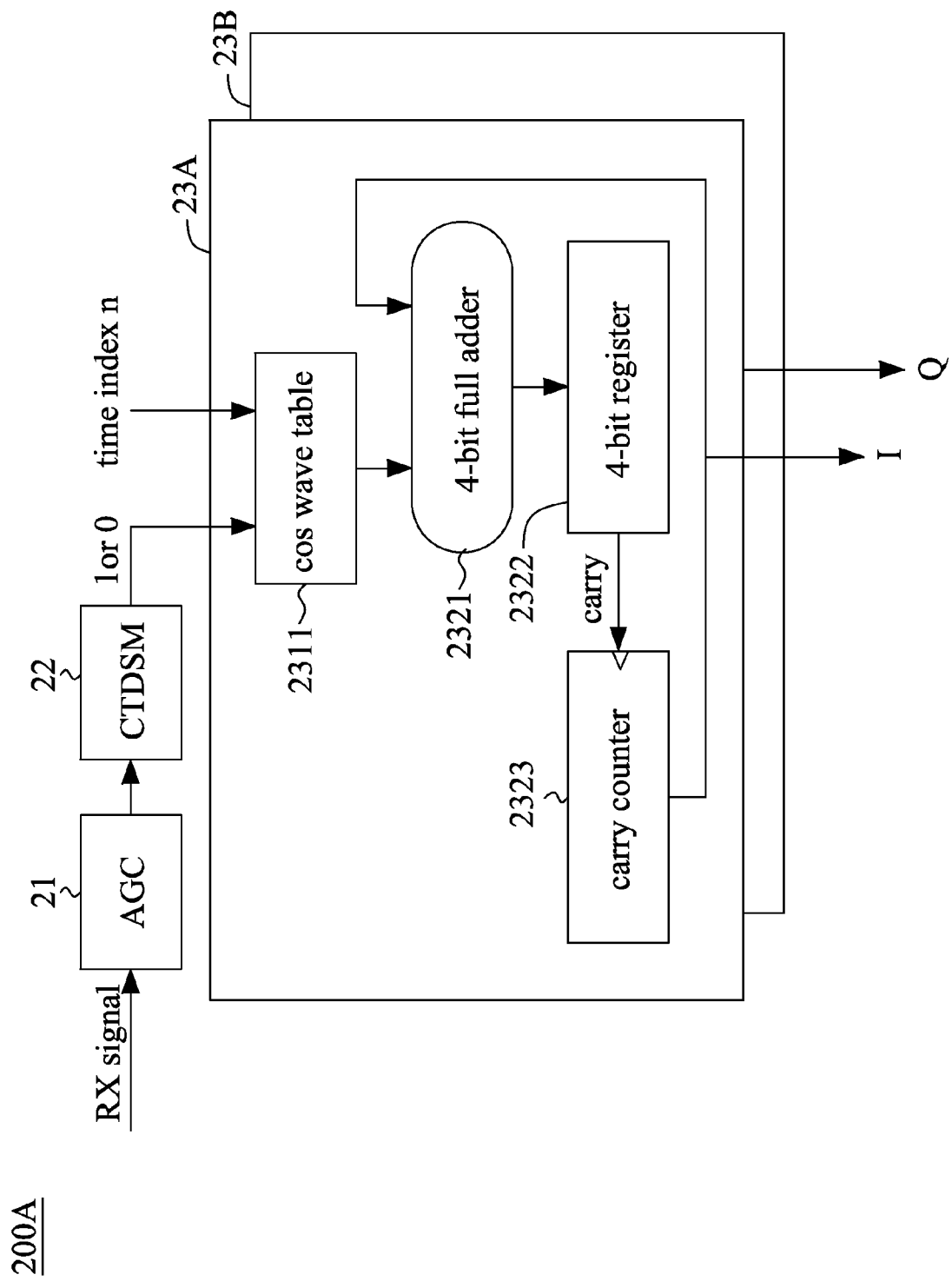
FIG. 4 shows a block diagram illustrated of a decimatorless continuous-time delta-sigma analog-to-digital receiver according to a first specific embodiment of the present invention.

FIG. 4 shows a block diagram illustrated of a decimatorless continuous-time delta-sigma analog-to-digital receiver ("receiver" hereinafter) 200A according to a first specific embodiment of the present invention. In the embodiment, the CTDSM 22 may include a one-bit quantizer (not shown) as an output stage to generate a one-bit digital output of either 0 or 1. The quadrature demodulator 23 of the embodiment may include an I-demodulator 23A and a Q-demodulator 23B for generating recovered contents I and Q of the RX signal, respectively.

Specifically speaking, as the one-bit digital output is generated from the CTDSM 22, the multipliers 231 in FIG. 3A/3B are no longer required. Instead, quadrature carrier (e.g., sinusoid) tables are used in the I-demodulator 23A and the Q-demodulator 23B. For example, a cosine wave table 2311 is used in the I-demodulator 23A, and a sine wave table (not shown) is used in the Q-demodulator 23B. In another embodiment, windowed quadrature carrier tables are used in the I-demodulator 23A and the Q-demodulator 23B.

A phase mixed digital output from the quadrature carrier table (e.g., the cosine wave table 2311) is then fed to a first input of a full adder (e.g., a 4-bit full adder in this example) 2321. The content of the full adder 2321 is copied to a register (e.g., a 4-bit register in this example) 2322. A carry of the register 2322 is used to trigger a carry counter (e.g., a ripple counter) 2323, and an output (i.e., the content I or Q) of the carry counter 2323 is fed back to a second input of the full adder 2321. Although not shown, the Q-demodulator 23B has a structure similar to that of the I-demodulator 23A with the exception that, the cosine wave table 2311 is replaced with a sine wave table.

Figure 5:
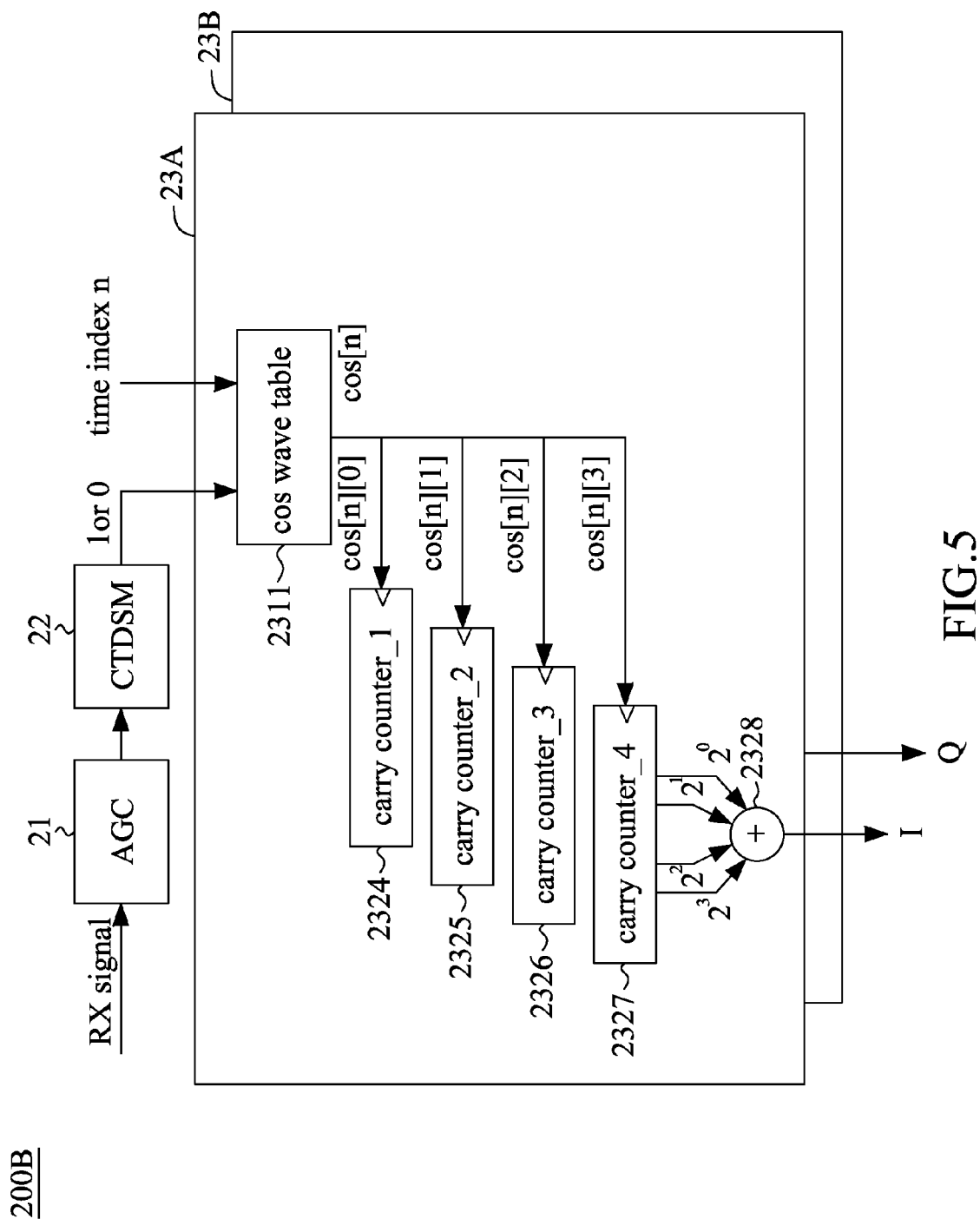
FIG. 5 shows a block diagram illustrated of a decimatorless continuous-time delta-sigma analog-to-digital receiver according to a second specific embodiment of the present invention.

FIG. 5 shows a block diagram illustrated of a decimatorless continuous-time delta-sigma analog-to-digital receiver ("receiver" hereinafter) 200B according to a second specific embodiment of the present invention. The present specific embodiment is similar to that shown in FIG. 4 with the exception that, different bits of the digital output (e.g., cos [n][0], cos [n][1], cos [n][2] and cos [n][3]) are used to trigger corresponding carry counters 2324-2327. Subsequently, outputs of the carry counters 2324-2327 are shifted (e.g., the output of the fourth carry counter 2327 is shifted by 3 bits, the output of the third carry counter 2326 is shifted by 2 bits, and the output of the second carry counter 2325 is shifted by 1 bit). The shifted outputs of the carry counters 2324-2327 are then summed up by a summer 2328 to generate recovered content I or Q of the RX signal. Although not shown, the Q-demodulator 23B has a structure similar to that of the I-demodulator 23A with the exception that, the cosine wave table 2311 is replaced with a sine wave table.

Although specific embodiments have been illustrated and described, it will be appreciated by those skilled in the art that various modifications may be made without departing from the scope of the present invention, which is intended to be limited solely by the appended claims.

What is claimed is:

1. A decimatorless continuous-time delta-sigma analog-to-digital receiver, comprising:
a continuous-time delta-sigma modulator (CTDSM) that receives a receiving signal and is configured to encode analog signals into digital signals; and
a demodulator that receives a single digital output of the CTDSM and is configured to recover information content from the receiving signal;
wherein no decimator is used to down convert a sampling rate of the receiving signal;
wherein the CTDSM itself possesses a low-pass filtering function and thus no low-pass filter is required to precede the CTDSM;
wherein the demodulator works at a frequency that is at least higher than a cut-off frequency of the low-pass filtering function; and
wherein the demodulator comprises a quadrature demodulator, which comprises:
a pair of phase mixers that respectively multiply the single digital output of the CTDSM by two quadrature carriers that are out of phase with each other, thereby resulting in phase mixed digital outputs, respectively, each said phase mixer comprising a quadrature carrier table; and
a pair of adders that sum up the phase mixed digital outputs from the pair of phase mixers, respectively, thereby resulting in recovered contents of the receiving signal, wherein each said adder comprises a plurality of carry counters that are correspondingly triggered by different bits of the phase mixed digital output and a summer that sums up shifted outputs of the carry counters.

2. The receiver of claim 1, further comprising an automatic gain controller that receives the receiving signal and is disposed before the CTDSM.

3. The receiver of claim 1, wherein the CTDSM comprises a continuous-time noise-shaping filter.

4. The receiver of claim 1, wherein each said phase mixer comprises a multiplier.

5. The receiver of claim 1, wherein each said quadrature carrier is pre-multiplied by a window function.

6. The receiver of claim 1, wherein each said adder comprises:
a full adder having a first input for receiving the phase mixed digital output;
a register that receives a content of the full adder; and
a carry counter that is triggered by a carry of the register, an output of the carry counter being fed back to a second input of the full adder.

* * * * *